(12) United States Patent
Guillot et al.

(10) Patent No.: US 10,627,303 B2
(45) Date of Patent: Apr. 21, 2020

(54) DEVICE FOR MEASURING AND SYSTEM FOR MEASURING A PRESSURE COMPRISING A PRESSURE SENSOR

(71) Applicant: SAFRAN ELECTRONICS & DEFENSE, Boulogne Billancourt (FR)

(72) Inventors: Francois Guillot, Boulogne Billancourt (FR); Olivier Leborgne, Boulogne Billancourt (FR); Patrice Chetanneau, Boulogne Billancourt (FR)

(73) Assignee: SAFRAN ELECTRONICS & DEFENSE, Boulogne Billancourt (FR)

( * ) Notice: Subject to any disclaimer, the term of this patent is extended or adjusted under 35 U.S.C. 154(b) by 33 days.

(21) Appl. No.: 15/759,761

(22) PCT Filed: Sep. 16, 2016

(86) PCT No.: PCT/EP2016/072078
§ 371 (c)(1),
(2) Date: Mar. 13, 2018

(87) PCT Pub. No.: WO2017/046402
PCT Pub. Date: Mar. 23, 2017

(65) Prior Publication Data
US 2019/0049328 A1  Feb. 14, 2019

(30) Foreign Application Priority Data
Sep. 17, 2015  (FR) ...................................... 15 58762

(51) Int. Cl.
*B60C 23/04*   (2006.01)
*G01L 19/14*   (2006.01)
(Continued)

(52) U.S. Cl.
CPC ............ *G01L 19/148* (2013.01); *B60C 23/00* (2013.01); *B60C 23/043* (2013.01);
(Continued)

(58) Field of Classification Search
CPC .. G01M 17/02; G01M 17/021; G01M 17/022; G01M 17/027; G01M 17/025;
(Continued)

(56) References Cited

U.S. PATENT DOCUMENTS

2007/0251619 A1* 11/2007 Bertrand ................. B60C 19/00
                                                            152/152.1
2015/0187961 A1*  7/2015 Kim ........................ H01L 29/84
                                                            157/415
(Continued)

FOREIGN PATENT DOCUMENTS

| GB | 2394055 A | 4/2004 |
| WO | WO 02/14089 A1 | 2/2002 |
| WO | WO2009003457 A1 | 1/2009 |

*Primary Examiner* — Andre J Allen
(74) *Attorney, Agent, or Firm* — Muncy, Geissler, Olds & Lowe, P.C.

(57) ABSTRACT

A pressure measurement device includes a pressure sensor including a printed circuit card having a portion that is to be subjected to pressure for measurement. The printed circuit card has strain detectors mounted on the portion to measure deformation of the printed circuit card under the influence of the pressure. The device may be included in a measurement system.

18 Claims, 4 Drawing Sheets

(51) Int. Cl.
  *G01L 9/00* (2006.01)
  *G01L 19/08* (2006.01)
  *B60C 23/00* (2006.01)
  *G01L 1/22* (2006.01)
  *G01L 9/02* (2006.01)
  *H05K 1/18* (2006.01)

(52) U.S. Cl.
  CPC .......... *G01L 1/2287* (2013.01); *G01L 9/0042* (2013.01); *G01L 9/0051* (2013.01); *G01L 9/0055* (2013.01); *G01L 9/025* (2013.01); *G01L 19/086* (2013.01); *H05K 1/189* (2013.01); *H05K 2201/09227* (2013.01); *H05K 2201/10151* (2013.01)

(58) Field of Classification Search
  CPC ...... G01M 17/024; G01M 17/10; G01M 7/08; G01M 17/0076; G01M 17/013; G01M 17/03; G01M 17/04; G01M 17/06; G01M 17/08; G01M 1/02; G01M 1/045; G01M 1/12; G01M 1/225; G01M 3/04; G01M 3/40; G01M 5/0091; G01M 7/02; G01M 99/00; G01M 99/002; B60C 23/0494; B60C 23/04; B60C 23/0493; B60C 2019/004; B60C 19/00; B60C 23/0498; B60C 23/064; B60C 23/0488; B60C 23/0496; B60C 23/0408; B60C 23/041; B60C 23/0411; B60C 23/20; B60C 11/243; B60C 11/246; B60C 23/06; B60C 23/061; B60C 23/00; B60C 23/0486; B60C 11/0083; B60C 13/003; B60C 2009/2038; B60C 23/003; B60C 23/004; B60C 23/02; B60C 23/0401; B60C 23/0406; B60C 23/0416; B60C 23/0433; B60C 23/0455; B60C 23/0489; B60C 23/0491; B60C 25/002; B60C 25/005; B60C 25/007; B60C 29/02; B60C 3/04; B60C 99/00; B60C 99/006; B60C 11/24; B60C 13/001; B60C 13/02; B60C 15/0036; B60C 17/02; B60C 2009/0071; B60C 2009/2022; B60C 2200/02; B60C 2200/06; B60C 2200/065; B60C 23/001; B60C 23/007; B60C 23/008; B60C 23/0413; B60C 23/0427; B60C 23/0447; B60C 23/0454; B60C 23/0459; B60C 23/0462; B60C 23/0467; B60C 23/0471; B60C 23/0472; B60C 23/0474; B60C 23/0476; B60C 23/0484; B60C 23/065; B60C 23/066; B60C 23/10; B60C 25/0458; B60C 25/056; B60C 25/132; B60C 25/138; B60C 25/18; B60C 29/005; B60C 9/005; B60C 9/18; B60C 9/1807; B60C 9/20; B60C 9/28; G01L 17/00; G01L 17/005; G01L 19/0645; G01L 19/147; G01L 1/16; G01L 1/18; G01L 7/187; G01L 9/008; G01L 9/0098
  USPC ................................................. 73/146–146.8
  See application file for complete search history.

(56) References Cited

U.S. PATENT DOCUMENTS

2016/0069755 A1* 3/2016 Samejima .............. G01D 11/30
  73/777
2016/0069758 A1* 3/2016 Kroeger ................... G01L 1/26
  73/862.623

* cited by examiner

DEVICE FOR MEASURING AND SYSTEM FOR MEASURING A PRESSURE COMPRISING A PRESSURE SENSOR

The invention relates to a pressure sensor. The invention also relates to a measurement device and to a pressure measurement system including such a sensor.

TECHNOLOGICAL BACKGROUND OF THE INVENTION

In the field of aviation, pressure sensors associated with landing gear tires are generally fastened to the rims of said tires and they transmit their data to an onboard computer of the aircraft. Such sensors generally turn out to be complex and thus usually incorporate strain gauges and processor means for processing the measurements taken by the strain gauges.

OBJECT OF THE INVENTION

An object of the invention is to propose a pressure sensor of simplified structure and a measurement device and a pressure measurement system including such a sensor.

BRIEF SUMMARY OF THE INVENTION

In order to achieve this object, the invention provides a pressure sensor comprising a printed circuit card having a portion that is to be subjected to the pressure for measurement, the printed circuit card having strain detectors mounted on said portion to measure deformation of said portion under the influence of said pressure.

Thus, the printed circuit card serves directly as a deformable portion and the strain detectors are thus mounted directly on the printed circuit card, with the sensor not requiring any additional specific support.

Advantage is thus taken of the intrinsic characteristics of a printed circuit card, which is naturally elastically deformable, in order to simplify the structure of the sensor.

The sensor is thus relatively simple in structure.

Furthermore, because of its simpler structure, the sensor is less sensitive to its environment, and in particular less sensitive to temperature and vibration, which is particularly useful when the sensor is placed in a demanding environment, such as in or in the vicinity of an aircraft tire, for example.

In addition, the pressure sensor is also less expensive.

Furthermore, the pressure sensor is simpler to reproduce easily on a large scale, thereby facilitating production.

Naturally, at least the portion of the printed circuit card of the sensor that is to be subjected to the pressure for measurement is elastically deformable at least over a predetermined range of pressures that are to be measured by the pressure sensor.

Typically, the predetermined range of pressures is zero to 21 bars when the pressure sensor is for use in measuring the pressure of an aircraft tire. By way of example, the printed circuit card is then made of composite material. By way of example, the printed circuit card 4 may be made of a glass epoxy matrix.

The invention also provides a pressure measurement device comprising:
  a sensor as described above for securing to an element having a pressure that is to be determined; and
  a stationary portion that is for securing to face a path of the sensor in order to receive measurements required by the sensor and in order to transmit them to the processor means.

The invention also provides a system for measuring the pressure of a vehicle tire, the system including a measurement device for measuring the pressure of the tire and processor means for processing measurements acquired by the measurement device, the processor means being for mounting on the vehicle remotely from the tire, the measurement device comprising:
  a sensor as described above that is to be secured to rotate with the tire; and
  a stationary portion arranged facing a path of the sensor in order to receive measurements acquired by the sensor.

As a result, only the measurement device is arranged in the proximity of the tire, the processor means being totally remote from the tire. This makes it possible to limit the amount of electronics that is in the immediate proximity of the tire where it is subjected to an environment that is very severe, and to arrange for the majority of the electronics, and in particular the electronics that is more sensitive, in an environment that is more favorable, such as for example inside the vehicle where it is subjected to an environment that is more clement.

The system is thus found to be less sensitive to its environment, and in particular less sensitive to temperature and vibration, which is particularly useful when the sensor is placed in a demanding environment, such as in or in the vicinity of an aircraft tire.

In addition, the sensor is always integrated in the immediate proximity of the tire, thereby making it possible to measure the pressure of the tire both when the vehicle is stationary and when it is moving.

BRIEF DESCRIPTION OF THE DRAWINGS

The invention can be better understood in the light of the following description of the non-limiting embodiments of the invention given with reference to the accompanying figures, in which.

DETAILED DESCRIPTION OF THE INVENTION

With reference to the various figures, the system for measuring pressure in the first particular embodiment of the invention comprises a measurement device 1 and processor means 2 for processing measurements acquired by the measurement device 1. In this example, the system for measuring pressure is associated with an aircraft for the purpose of measuring the pressure of one of the tires of the aircraft.

The measurement device 1 is thus associated with said tire and is arranged in the immediate proximity of said tire, and the processor means 2 are mounted on the aircraft so as to be remote from said tire. Preferably, the processor means 2 are arranged in the pressurized atmosphere of the aircraft. The processor means 2 may for example be integrated in one of the onboard computers of the aircraft.

Figure 1:
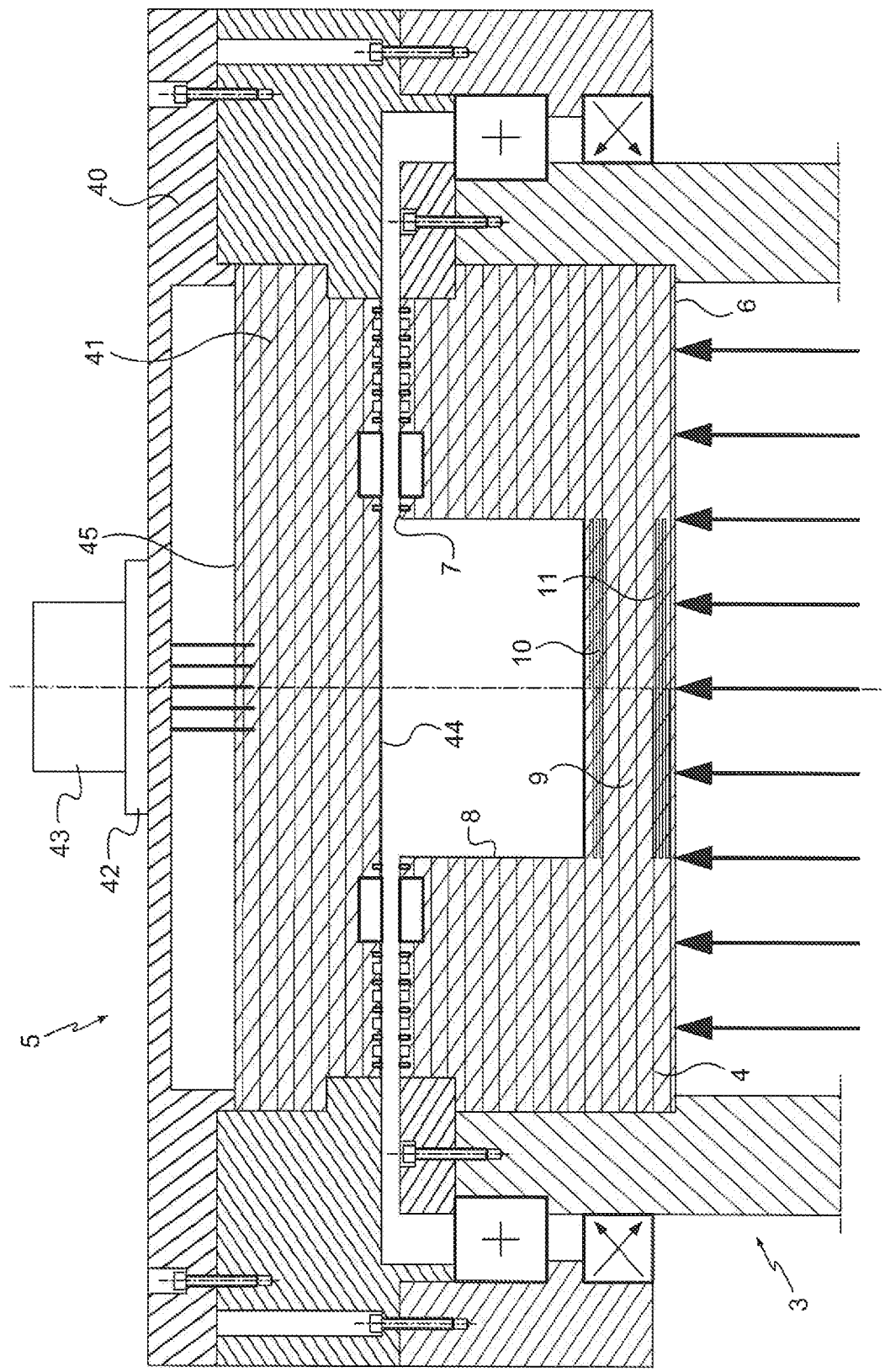
FIG. 1 is a diagrammatic section view of the pressure sensor in a first particular embodiment of the invention, together with a stationary portion associated with the sensor in order to receive measurements acquired by the sensor of the associated measurement system.
Figure 2:
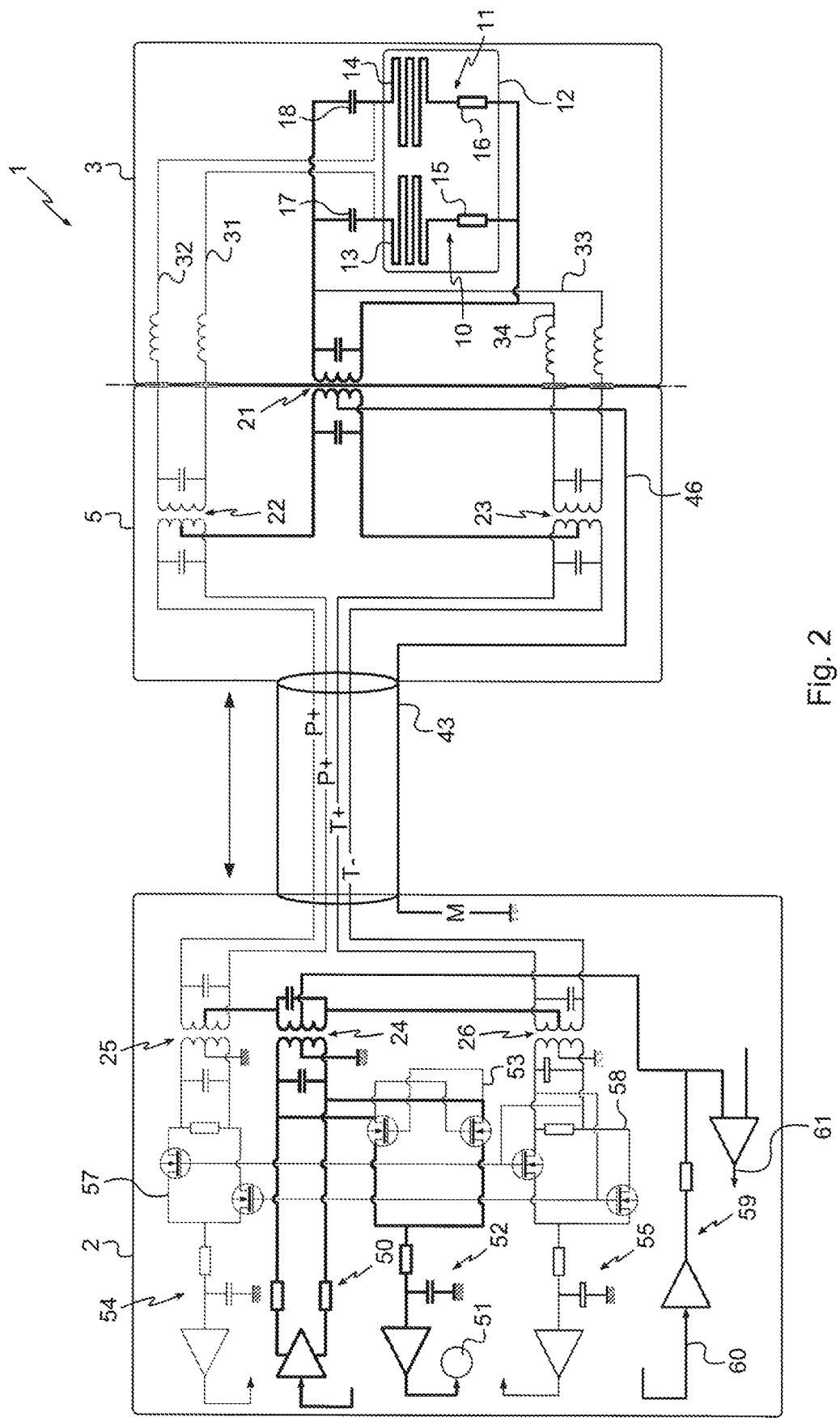
FIG. 2 is a diagram showing the system for measuring the pressure of a vehicle tire including the sensor and the stationary portion shown in FIG. 1.

The measurement device 1 includes a pressure sensor 3 arranged so as to rotate with the tire. The pressure sensor 3 comprises a printed circuit card 4 having an elastically deformable portion that is to be subjected to the tire pressure that is to be measured (represented by arrows in FIG. 1). More precisely in this example, the printed circuit card 4 is secured to the rim of the tire so as to be rigidly fastened to the rim and thus to the tire. In addition, the printed circuit card 4 is arranged so that its elastically deformable portion is directly in contact with the gas present inside the tire.

The measurement device 3 also has a stationary portion 5 that is secured to the aircraft in the immediate proximity of the tire. By way of example, the stationary portion 5 is arranged on the landing gear axle carrying the tire of pressure that is to be measured by the sensor 3. The stationary portion 5 is naturally secured to the vehicle so as to face the rotary path of the sensor 3 in order both to receive measurements acquired by the sensor 3 for forwarding to the processor means 2, and to power the sensor.

The detailed description below deals successively with the sensor 3, with the stationary portion 5, and with the processor means 2.

Concerning the sensor 3, the printed circuit card 4 is made of electrically insulating material. By way of example, the printed circuit card 4 is made of composite material. The printed circuit card 4 may for example be made of glass epoxy matrix. The printed circuit card 4 has a first main face 6 and a second main face 7 extending opposite from the first main face 6 and parallel to said first main face 6. The two main faces 6 and 7 are connected together by one or more side faces of the printed circuit card 4 depending on the main shape of the printed circuit card 4 (e.g. circular or rectangular). Both main faces 6 and 7 are plane. In this example, the sensor 3 is arranged so that the main first face 6 of the printed circuit card 4 is directly in contact with the gas present inside the tire, with the second main face 7 thus being subjected, on the contrary, to ambient pressure around the tire.

The printed circuit card 4 also has a central orifice 8 extending from the second main face 7 towards the first main face 6 but without opening out in said first main face 6. In this example, the printed circuit card 4 is thus generally in the form of a cup.

The printed circuit card 4 thus has a central zone 9 of minimum thickness that is defined on top by the bottom of the orifice 8 and at the bottom by the first main face 6. In this example, it is this zone 9 that forms the elastically deformable portion of the sensor 3 that is to be subjected to the pressure that is to be measured. Although another portion of the sensor 3 is subjected to the pressure of the tire, the sensor 3 is shaped so that only said portion 9 deforms under the action of the pressure in the tire. For this purpose, the remainder of the sensor 3 is of thickness that is sufficiently great to be insensitive to the action of the pressure in the tire.

For example, the printed circuit card 4 is shaped so that said card presents a thickness lying in the range 2 millimeters (mm) to 3 mm in the zone 9 of minimum thickness and a thickness of about 5 mm in the remainder of said printed circuit card 4. The printed circuit card 4 is also shaped in such a manner that the zone 9 presents an area lying in the range 1 square centimeter ($cm^2$) to 2 $cm^2$.

The printed circuit card 4 includes strain detectors on or in said zone 9 for measuring deformation of the printed circuit card 4 under the influence of the pressure in the tire. There are two strain detectors in this example and they are arranged so as to form a measurement half-bridge 12. Typically, the first strain detector 10 comprises a first track 13 of electrically conductive material, and the second strain detector 11 comprises a second track 14 of electrically conductive material, the first and second tracks 13 and 14 being arranged on the zone 9 (inside said zone 9 and/or on the surface of said zone 9) and they are thus subjected to the deformation of said zone 9.

As a result, deformation of the zone 9 leads to deformation of said tracks 13 and 14 and thus to a change in their electrical properties that is representative of the deformation of the zone 9 and consequently of the pressure that exists in the tire. Specifically, variation in the length of each track 13, 14 due to its deformation leads to a variation in its electrical resistance.

The tracks 13 and 14 preferably have respective sinuous portions that are more sensitive to deformation. By way of example, the tracks 13 and 14 are made of copper. The two strain detectors 10 and 11 are preferably identical so that the half-bridge 12 is symmetrical.

Preferably, in order to improve the sensitivity of the strain detectors 10 and 11, the first detector 10 has a first resistor 15 associated with the first track 13, and the second detector 11 has a second resistor 16 associated with the second track 14. Said resistors 15 and 16 are likewise installed in the printed circuit card 4 in the zone 9. Said resistors 15 and 16 are connected in series with the associated detector tracks. Said resistors 15 and 16 may be nano-resistors, for example.

The printed circuit card 4 also has two capacitors associated with the half-bridge 12 in order to cause the half-bridge 12 to be resonant when it is powered by the stationary portion 5 as described below, the first detector 10 being associated with a first capacitor 17 (thus forming a first assembly comprising a first detector and a first capacitor), and the second detector 11 is associated with a second capacitor 18 (thus forming a second assembly of a second detector and a second capacitor).

This makes it possible to improve the sensitivity of the half-bridge 12.

The capacitors 17 and 18 are connected in series with the associated detectors via the ends of the tracks that are remote from their ends connected to the associated resistors of the detectors. For each detector, the track thus lies between the capacitor at one end and the resistor at the other. The capacitors 17 and 18 are arranged on the printed circuit card 4 outside the zone 9. As a result, they are not subjected to the deformation of the zone 9. The capacitors 17 and 18 comprise two surfaces of electrically conductive material (also referred to as "plates") spaced apart by a portion of electrically insulating material. Preferably at least one of the surfaces is arranged inside the printed circuit card 4 so that said card directly forms the electrically insulating material portion of the capacitor. By way of example, the surfaces may be made of copper. By way of example, the surfaces may be tracks integrated in the printed circuit card 4.

In addition, the measurement device 1 includes power supply means for powering both detector-and-capacitor assemblies by means of the stationary portion 5.

Preferably, the measurement device 1 is arranged in such a manner that the sensor 3 and the stationary portion 5 are in a high frequency AC electrical relationship. As a result, the power supply means are configured in this example to power both detector-and-capacitor assemblies with high frequency AC. The term "high frequency" is used herein to mean a frequency of at least 50 megahertz (MHz). For example, the power supply means are configured to power both detector-and-capacitor assemblies at a frequency lying in the range 50 MHz to 300 MHz, and typically in the range 50 MHz to 150 MHz. Preferably, in this example, the power supply means are configured to supply high frequency power at an excitation frequency of about 100 MHz to both detector-and-capacitor assemblies: the excitation frequency of both assemblies and thus of the measurement half-bridge 12 is thus about 100 MHz.

For this purpose, the power supply means comprise a first transformer 21 having its primary attached to the stationary portion 5 and having its secondary attached to the sensor 3. More precisely in this example, one of the terminals of the secondary is connected to the first capacitor 17 and to the second capacitor 18, and the other of its terminals is connected to the first resistor 15 and to the second resistor 16. Both detector-and-capacitor assemblies are thus powered in parallel.

Advantageously, both detector-and-capacitor assemblies are thus powered wirelessly, in particular by using a high frequency AC power supply.

The primary and the secondary of the first transformer 21 are preferably each constituted by an inductor formed by a track of electrically conductive material that is integrated directly respectively on the stationary portion 5 and on the surface of the second main face 7 of the sensor 3. As a result, the first transformer 21 is not subjected to the deformation of the zone 9.

By way of example, said tracks may be made of copper.

The first transformer 21 is configured so that the primary and the secondary are put into resonance in order to increase the coupling between the primary and the secondary of the first transformer 21.

This serves to minimize coupling losses between the stationary portion 5 and the sensor 3.

Furthermore, via the two capacitors 17 and 18, both detector-and-capacitor assemblies are thus not only powered with high frequency AC, but they are also in resonance.

The measurement device 1 also has first communication means for communication between the sensor 3 and the stationary portion 5 in order to enable the stationary portion 5 to receive the measurements acquired by the strain detectors 10, 11.

Typically, the first communication means comprise a first LC circuit 31 (an electric circuit comprising a coil and a capacitor in series) associated with the first assembly and with the stationary portion 5, the coil of the first LC circuit 31 being connected to the first assembly between the first track 13 and the first capacitor 17, and a second LC circuit 32 associated with the second assembly and with the stationary portion 5, the coil of the second LC circuit 32 being connected to the second assembly between the second track 14 and the second capacitor 18.

By way of example, each coil is an inductor formed by a track of electrically conductive material. In this example, the track is formed directly at the surface of the second main face 7 of the sensor 3. By way of example, the track may be made of copper.

Each capacitor has two surfaces made of electrically conductive material that are spaced apart by a portion of electrically insulating material. Preferably, for each capacitor, one of the surfaces is arranged over the second main face 7 of the sensor 3 and the other surface is arranged facing it on the stationary portion 5, with the air between the sensor 3 and the stationary portion 5 thus forming directly the portion of the capacitor that is made of electrically insulating material. By way of example, the surfaces may be made of copper. By way of example, the surfaces may be tracks directly integrated in the printed circuit card 4.

Both LC circuits 31 and 32 are thus associated with the stationary portion 5 via the capacitors of said LC circuits.

As a result, the electric signals generated by the detector-and-capacitor assemblies are transmitted via the capacitors of the LC circuits 31 and 32 to the stationary portion 5. In advantageous manner, this transmission thus takes place wirelessly.

In addition, given the positions they occupy, the first communication means are not subjected to the deformation of the zone 9.

The first communication means thus make it possible to recover from the measurement device 1 an indication concerning the unbalance of the two detector-and-capacitor assemblies, which unbalance is representative of the deformation of the zone 9 under the action of the tire pressure.

In a particular embodiment, each resistor 15, 16 of the strain detectors 10, 11 is of resistance that is equal (when multiplied by the transformation ratio) to the characteristic impedance of the LC circuit associated with said strain detector.

This makes it possible to avoid standing waves passing through said LC circuits 31 and 32.

In a preferred embodiment, the measurement device 1 includes second communication means between the sensor 3 and the stationary portion 5 in order to enable the stationary portion 5 to receive measurements of the power supply at the terminals of both detector-and-capacitor assemblies, which measurements can be associated directly with the temperature of the detector-and-capacitor assemblies, and thus of the half-bridge 12, on the basis of temperature coefficients for the various elements of the detector-and-capacitor assemblies, and of the Thévenin generator that is equivalent to the power supply means of said assemblies.

These measurements can thus be used for weighting the deformation measurements taken by the half-bridge 12 as a function of the temperature of said half-bridge 12.

In this example, the second communication means comprise a third LC circuit 33 and a fourth LC circuit 34, both of which are associated with the secondary of the first transformer 21 and with the stationary portion 5, the coil of the third LC circuit 33 being connected to one of the terminals of the secondary of the first transformer 21 and the coil of the fourth LC circuit 34 being connected to the other terminal of the secondary of the first transformer 21.

By way of example, each coil is an inductor formed by a track of electrically conductive material. In this example, the track is formed directly at the surface of the second main face 7 of the sensor 3. The track may be made of copper, for example.

Each capacitor comprises two surfaces of electrically conductive material spaced apart by a portion of electrically insulating material. For each capacitor, one of the surfaces is arranged on the second main face 7 of the sensor 3 and the other of the surfaces is arranged facing it on the stationary portion 5, the air between the sensor 3 and the stationary portion 5 thus forming directly the portion of the capacitor that is made of electrically insulating material. By way of example, the surfaces may be made of copper. By way of example, the surfaces may be tracks directly integrated in the printed circuit card 4.

The third LC circuit 33 and the fourth LC circuit 34 are thus connected to the stationary portion 5 via the capacitors of said circuits 33 and 34.

As a result, the electric signals representative of the power supply for the detector-and-capacitor assemblies are transmitted via the capacitors of said circuits 33 and 34 to the stationary portion. Advantageously, this transmission thus takes place wirelessly.

In addition, the positions of the second communication means are such that they are not subjected to the deformation of the zone 9. The second communication means thus serve to recover from the measurement device 1 an indication concerning the power supply of the detector-and-capacitor assemblies, which indication is representative of the temperature of the detector-and-capacitor assemblies, and thus of the half-bridge 12.

It should thus be observed that the sensor 3, which is the portion of the pressure measurement system that is subjected to the most severe environment, has a relatively limited number of components. This makes it possible to improve the quality of pressure measurement.

In addition, the sensor 3 is particularly simple in terms of physical structure, since most of its components are directly integrated in the printed circuit card 4, e.g. being formed by electrically conductive tracks formed in or on the printed circuit card 4. In reality, apart from the resistors, the various elements of the sensor 3 are thus created by routing so as to be directly incorporated in the printed circuit card 4 and they are formed by the conductive tracks on said card 4. In contrast, the resistors are added to the printed circuit card 4, e.g. by silkscreen printing or by applying metal foil (generally not made of copper).

Furthermore, the deformation of the zone 9 has little or no incidence on the various coupling components (for power supply and communication) between the stationary portion 5 and the sensor 3, since said components are situated outside the zone 9.

In addition, there is no wired connection between the sensor 3 and the stationary portion 5: the coupling between the stationary portion 5 and the sensor 3 takes place solely via the capacitive connection (in this example for communicating measurements), or via the inductive connection (in this example for supplying power). The coupling between the sensor 3 and the stationary portion 5 is thus mixed (both capacitive and inductive). Furthermore, the coupling between the sensor 3 and the stationary portion 5 is also of the high frequency AC resonant type (both for supplying power and for communicating measurements).

Advantageously, coupling losses are also relatively small or even zero, in particular because of the existence of pairs of LC series resonant circuits (the first pair being formed by the first LC circuit 31 and the second LC circuit 32, and the second pair being formed by the third LC circuit 33 and the fourth LC circuit 34), because the various couplings are of the high frequency AC resonant type.

In this example, the sensor 3 as described thus presents measurement accuracy lying in the range 0.1 bar to 0.3 bar, and typically of 0.2 bar.

Furthermore, it may be observed that putting the two detector-and-capacitor assemblies into series resonance makes it possible to limit to even to eliminate reactive currents that would tend to disturb the measurements. Specifically, the inductive aspect of the device varies little because the system remains in or close to a resonance mode, thus making it possible to limit reactive currents.

In reality, the power supply current of the sensor 3 always sees a load that is real, while the power supply voltage is differential and increases as a result of changes to the complex impedances in the sensor 3 (as a result of the detectors deforming, a priori in symmetrical manner, which implies that the complex impedance vectors turn in opposite directions).

This makes it possible to improve the sensitivity of the sensor 3.

The stationary portion 5 in this example has a housing 40 that is rigidly secured to the axle and a coupler 41 that is itself rigidly fastened to said housing.

The housing 40 includes wired connection means for connecting the coupler 41 to the processor means 2. By way of example, the wired connection means comprise a connector 42 and a corresponding cable 43 connected at one end to said connector 42 and at its other end to a corresponding connector of the processor means 2. The cable 43 is preferably configured to provide differential transmission of the various signals between the measurement device 1 and the processor means 2. By way of example, the cable 43 may be of the Quadrax type.

The coupler 41 has a first main face 44 and a second main face 45 extending opposite from the first main face 44 and parallel to said first main face 44. The two mains faces 44 and 45 are connected together by one or more side faces of the coupler 41 depending on the main shape of the coupler 41 (e.g. circular or rectangular). The two main faces 44 and 45 are plane. In this example, the coupler 41 is arranged in such a manner that the first main face 44 faces the second main face 7 of the sensor 3 when the sensor 3 is level with the coupler 41 during its movement in rotation. In this example, the coupler 41 is shaped so that the first main face 44 of the coupler 41 has the same dimensions as the second main face 7 of the sensor 3, the first main face 44 of the coupler 41 nevertheless not including an orifice opening out therein. The coupler 41 is thus not in the form of a cup.

In preferred manner, the coupler 41 is a printed circuit card. Thus, as described above for the sensor 3, the various elements, in particular elements of transformer, capacitor, and coil type, that are included in the coupler 41 are preferably integrated directly in the printed circuit card, e.g. being formed by tracks of electrically conductive material arranged on or in the printed circuit card.

In order to transmit signals from the sensor 3 to the connection means of the housing 40, the first communication means comprise a second transformer 22 arranged on the coupler 41 and connected firstly to the connection means and secondly to the capacitors of the first LC circuit 31 and of the second LC circuit 32. More precisely in this example, one terminal of the secondary of the second transformer 22 is connected to the first LC circuit 31 and the other terminal of the secondary of the second transformer 22 is connected to the second LC circuit 32. The two detector-and-capacitor assemblies are thus connected in series to the stationary portion 5. In addition, each terminal of the primary of the second transformer 22 is connected independently to the connection means.

The signals generated by the detector-and-capacitor assemblies and representative of pressure are thus transmitted differentially to the processor means 2.

In addition, in order to transmit signals representative of the power supply of the detector-and-capacitor assemblies to the connection means of the housing 40, the second communication means include a third transformer 23 arranged on the coupler 41 and connected firstly to the connection means and secondly to the capacitors of the third LC circuit 33 and of the fourth LC circuit 34. More precisely in this example, one terminal of the secondary of the third transformer 23 is connected to the third LC circuit 33 and the other terminal of the secondary of the third transformer 23 is connected to the fourth LC circuit 34. In addition, each terminal of the primary of the third transformer 23 is connected independently to the connection means.

The signals generated by the secondary of the first transformer 21 and representative of the power supply of the detector-and-capacitor assemblies are thus transmitted differentially to the processor means.

The four lines connected at one end either to one of the terminals of the primary of the second transformer 22 or else to one of the terminals of the primary of the third transformer 23, and at the other end to the processor means via the differential transmission cable 43 are thus mutually independent.

Furthermore, in order to power the sensor 3, the primary of the first transformer 21, which is arranged on the stationary portion 5, is connected to the second transformer 22 and to the third transformer 23. In this example, one terminal of the primary of the first transformer 21 is connected to the primary of the second transformer 22, and the other terminal of the primary of the first transformer 21 is connected to the primary of the third transformer 23.

Furthermore, the stationary portion 5 has means for grounding the processor means. For this purpose, the grounding means comprise a line 46 connected firstly to the primary of the first transformer 21 and secondly to the ground of the processor means 2 via the cable 43.

Like the first transformer 21, the various transformers 22 and 23 of the stationary portion 5 are preferably tuned to the target excitation frequency of 100 MHz. This serves to optimize coupling and reduce or even eliminate reactive currents.

It should thus be observed that the stationary portion 5, which is also a portion of the pressure measurement system that is subjected to a very severe environment, includes a relatively limited number of components. This serves to improve the quality of pressure measurements.

In addition, the stationary portion 5 is particularly simple in terms of structure, since most of the components are integrated directly in the printed circuit card of the coupler 41, e.g. by being formed by electrically conductive tracks arranged on or in the printed circuit card.

The processor means 2 comprise a power supply circuit 50 for powering the power supply means of the measurement device 1. For this purpose, the power supply circuit 50 has a high frequency AC power source 51 which thus has an excitation frequency that is equal to about 100 MHz in this example. The power supply circuit 50 also has a fourth transformer 24 connected to said power source 51.

The processor means preferably include a measurement circuit 52 of the power supply circuit 50 for monitoring and optionally controlling the high frequency AC power source 51. Typically, the measurement circuit 52 is connected to the power supply circuit 50 by synchronous detector means such as a synchronous demodulator 53.

The processor means 2 also include a circuit 54 for measuring the tire pressure. For this purpose, said circuit 54 has a fifth transformer 25 of which the first terminal of the secondary is connected via the cable 43 to the first terminal of the primary of the second transformer 22 of the measurement device 1, and of which the second terminal of the secondary is connected, via the cable 43, to the second terminal of the primary of the second transformer 22. This ensures that the signals generated by the detector-and-capacitor assemblies are transmitted to the pressure measurement circuit 54 which can then process these signals.

The fifth transformer 25 is also powered by the power supply circuit 50 of the processor means 2, in this example by connecting the secondary of the fifth transformer 25 to the secondary of the fourth transformer 24. This serves to power both of the detector-and-capacitor assemblies via the pressure measurement circuit 54, the coil 43, and the measurement device 1.

The same wired connections between the processor means 2 and the measurement device 1 thus serve simultaneously for supplying power and for transmitting signals generated by the two detector-and-capacitor assemblies.

Furthermore, the processor means 2 include a circuit 55 for measuring the temperature of the detector-and-capacitor assemblies and thus of the half-bridge 12.

For this purpose, said circuit 55 has a sixth transformer 26 of which the first terminal of the secondary is connected by the cable 43 to the first terminal of the primary of the third transformer 23 of the measurement device 1, and of which the second terminal of the secondary is connected, via the cable 43, to the second terminal of the primary of the third transformer 23. This ensures that signals representative of the power supply to the detector-and-capacitor assemblies are transferred to the temperature measurement circuit 54, which can thus process these signals.

It should be recalled specifically that the power supply voltage of the detector-and-capacitor assemblies varies as a function of the temperature of said assemblies, in particular because of the known intrinsic characteristics of those two assemblies. On the basis of the measurement of the power supply voltage and on the basis of knowing that data, it is thus possible to deduce therefrom the temperature of the assemblies.

Furthermore, the sensor 3 is subjected to very great variations in temperature compared with the remainder of the system. The fact of measuring temperature at the sensor 3 (by studying its power supply voltage) makes it possible to minimize the influence of variation in the electrical resistance of the power supply line as a function of temperature, thereby improving the accuracy with which temperature is measured. The temperature of the zone of the system that is the most sensitive to temperature is thus advantageously measured.

In addition, in order to process the signals generated by the strain detectors 10, 11, while taking account of the temperature of the half-bridge 12, the pressure measurement circuit 54 and the temperature measurement circuit 55 are connected together. The temperature measurement circuit 55 is connected to the pressure measurement circuit 54 both upstream from the fifth transformer 25 and also downstream from the sixth transformer 26. In particular manner, this connection is performed by synchronous detector means of the processor means 2. Typically, the pressure measurement circuit 54 has a synchronous demodulator 57 arranged upstream from the fifth transformer 25, and the temperature measurement circuit 55 likewise has a synchronous demodulator 58 arranged upstream from the sixth transformer 26, these two circuits being connected together via said two synchronous demodulators 57 and 58.

The temperature measurement circuit 55 thus performs its own (self-synchronous) demodulation, since the signals received over this circuit are never zero, and also makes it possible to control the demodulation of the pressure measurement circuit 54 which has signals that can sometimes be zero.

The demodulation performed by these two circuits is thus independent of the length of the power supply line.

The sixth transformer 26 is also powered by the power supply circuit 51, in this example by connecting the secondary of the sixth transformer 26 to the secondary of the fourth transformer 24. This also serves to power the detector-and-capacitor assemblies via the temperature measurement circuit 55, the cable 43, and the measurement device 1.

The same wired connections between the processor means 2 and the measurement device 1 thus serve simultaneously to supply power and to transmit signals representative of the power supply of the detector-and-capacitor assemblies.

In a particular embodiment, the processor means 2 include a monitor circuit 59 for monitoring the output of the power supply circuit 50 (i.e. the power supply line connected to the pressure measurement circuit 54 and to the temperature measurement circuit 55).

This makes it possible to evaluate the losses caused by the power supply line itself. As a result, these losses can be taken into account when estimating the temperature and pressure measurements.

Furthermore, this makes it possible to monitor the power supply circuit 50 in order to monitor the power supply.

In addition, this makes it possible to identify a potential problem in the power supply circuit 50, such as a short circuit, for example.

Unlike the remainder of the pressure measurement system, the monitor system 59 is powered with direct current (DC).

Typically, the monitor circuit 59 includes means for sending an electric pulse 60 to the power supply line and means for detecting the return wave 61 following the pulse. This serves to measure the length of the power supply line by measuring the travel time and the amplitude of the return pulse.

Advantageously, the quality of the power supply line can thus be monitored, with the return wave passing via the shielding of the fourth transformer 24 in order to return to the monitor circuit.

Furthermore, it is thus possible to estimate the electrical resistance specifically of the power supply line by measuring the length of the power supply line and knowing the intrinsic characteristics of the power supply line.

The processor means 2 as described thus serve to measure the pressure of the tire. In particular manner, the pressure of the tire can be measured continuously.

Preferably, as for the sensor 3 and the stationary portion 5, the various transformers in the processor means 2 are tuned to the target excitation frequency of 100 MHz. This makes it possible to optimize coupling and lower or even eliminate reactive currents.

Preferably, the processor means 2 perform the following method for each new pressure measurement:
  monitoring the power supply line by means of the monitoring circuit 59;
  acquiring signals representative of the power supply of the half-bridge 12 by means of the temperature measurement circuit 55;
  acquiring signals representative of the deformation of the printed circuit card 4 by means of the pressure measurement circuit 54; and
  estimating the pressure on the basis of the monitoring, of the signals representative of the power supply of the half-bridge 12, and of the signals representative of the deformation of the printed circuit card 4.

Figure 3:
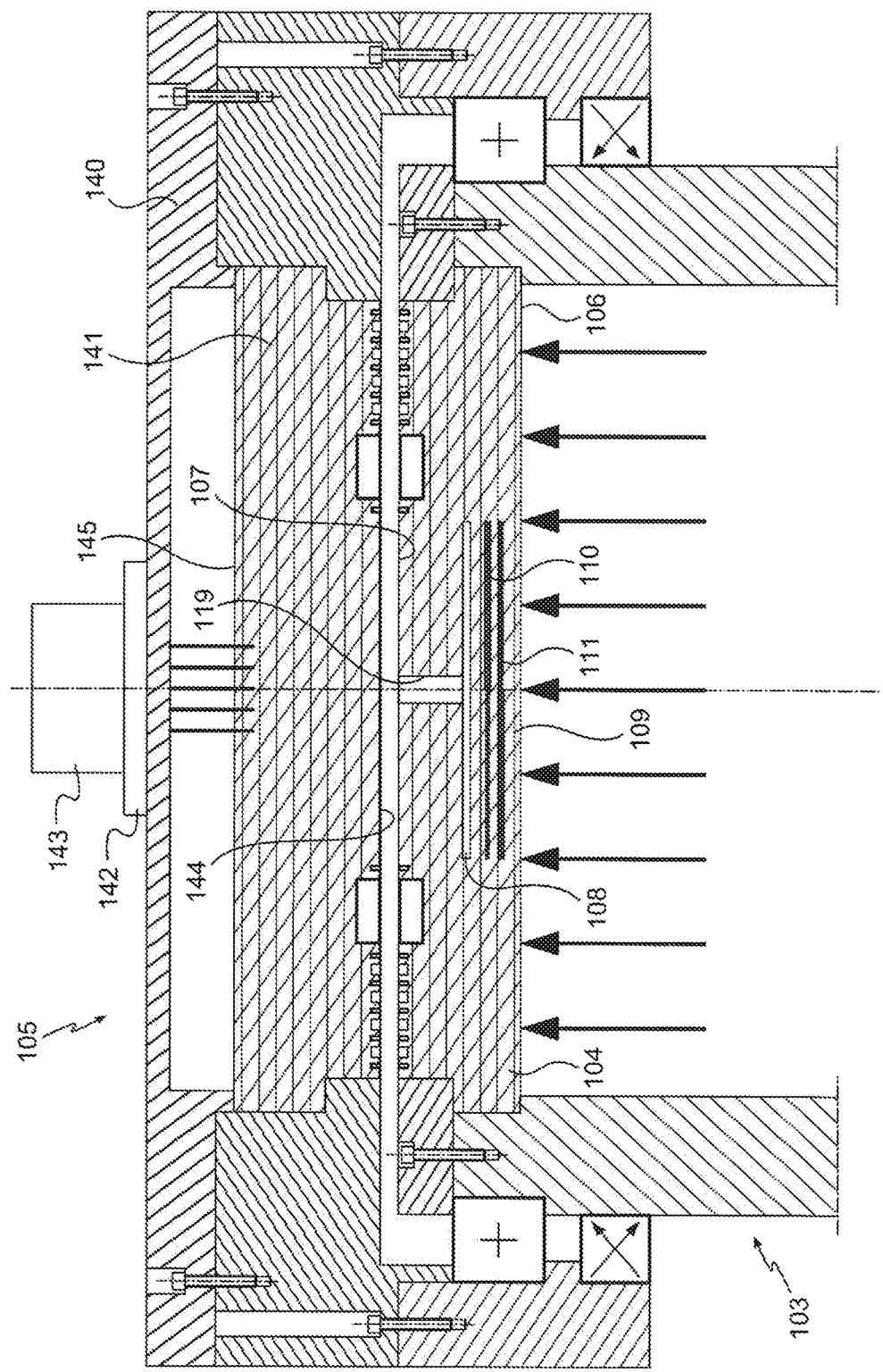
FIG. 3 is a diagrammatic section view of the pressure sensor in a second particular embodiment of the invention together with a stationary portion associated with the sensor for receiving measurements acquired by the sensor of the associated measurement system.

With reference to FIG. 3, the pressure measurement system in a second embodiment of the invention is identical to the first embodiment, with the exception that the sensor 103 is configured differently.

Unlike the first embodiment in which the sensor orifice extends from the second main face towards the first main face but without opening out in said main face, in the second embodiment, the orifice 108 extends entirely inside the printed circuit card 104 without opening out from said printed circuit card 104. The orifice 108 is typically arranged in the center of said printed circuit card 104 (relative to the main faces 106, 107 of said printed circuit card 104). By way of example, the orifice 108 is arranged at one-third of the height of the printed circuit card 104 (going from the first main face 106 of said printed circuit card 104). By way of example, the orifice 108 may have a height lying in the range 0.5 mm to 1 mm. Typically, the orifice 108 has a height of 0.5 mm when the zone 109 presents a thickness of 2 mm, i.e. it occupies 25% of the thickness of said zone 109.

The central zone 109 of minimum thickness is thus always defined on top by the bottom of the orifice 108 and at the bottom by the first main face 106. Nevertheless, since the orifice 108 in this example does not open out, in particular does not open out into the second main face 107 of the printed circuit card 104, the orifice 108 thus limits deformation of the zone 109 by virtue of its ceiling (opposite from its bottom that defines said zone 109). This serves advantageously to avoid excessive deformation of the zone 109 in the event of excess pressures in the tire, which are usually transient, where such deformation could degrade or plastically deform said zone 109.

In particular manner, the printed circuit card 104 also has an opening 119 extending from the second main face 107 towards the orifice 108, and opening out into the orifice 108. The opening 119 is preferably arranged in the printed circuit card 104 so as to open out in the center of said orifice 108. The opening 119 naturally presents transverse dimensions (i.e. relative to the direction going from the first main face 106 to the second main face 107) that are smaller than the transverse dimensions of the orifice 108 so as to avoid coming close to the cup shape of the first embodiment.

The opening 119 thus allows air to reach the orifice 108, thereby limiting excessive confinement of the zone 109.

Naturally, the invention is not limited to the embodiment described and embodiment variations may be made thereto without going beyond the ambit of the invention as defined by the claims.

In particular, although in this example the sensor is associated with an aircraft tire, the sensor could be used for measuring pressure in any element other than an aircraft tire. Likewise, although the system is associated with an aircraft tire, the system could be used for measuring the pressure of a tire of any other vehicle, such as for example a motor vehicle tire.

Although these various tracks and surfaces made of electrically conductive material are made of copper in this example, these tracks and surfaces could be made of some other material, e.g. of Kovar (registered trademark), i.e. of FeNiCo alloy. The various elements described could be based on nano-materials. For example, the strain detectors could be made of nano-materials. Although in this example the majority of the elements described are formed from tracks, said elements could be resistors, capacitors, coils, . . . fitted onto the associated support rather than being formed directly on the support.

Although in this example the capacitive coupling between the sensor and the stationary portion take place using capacitors having electrically conductive surfaces that are plane, said capacitors could be of other shapes. For example, the sensor and the stationary portion could be configured so that one of them presents a female portion, e.g. a surface of revolution, covered by an electrically conductive surface, while the other presents a male portion, e.g. a surface of revolution, covered by an electrically conductive surface, the female portion extending in the male portion so as to form a capacitor. By way of example, the female portion could have a height of 20 micrometers (μm). The male portion may be formed by mechanical machining or by laser machining.

Interconnections between the various elements of the systems other than those described can be envisaged. For example, the power source of the power supply circuit could be controlled as a function of the temperature measurement, typically in order to have a maximum voltage across the terminals of the half-bridge.

Furthermore, although in this example the coupling between the stationary portion and the sensor takes place via a capacitive connection for communicating measurements and via an inductive connection for power supply, the stationary portion and the sensor could be configured in some other way, such that the coupling between the stationary portion and the sensor takes place via a capacitive connection for power supply and via an inductive connection for communicating measurements.

Either way, the combination of capacitive and inductive makes it easier to segregate the connections.

Figure 4:
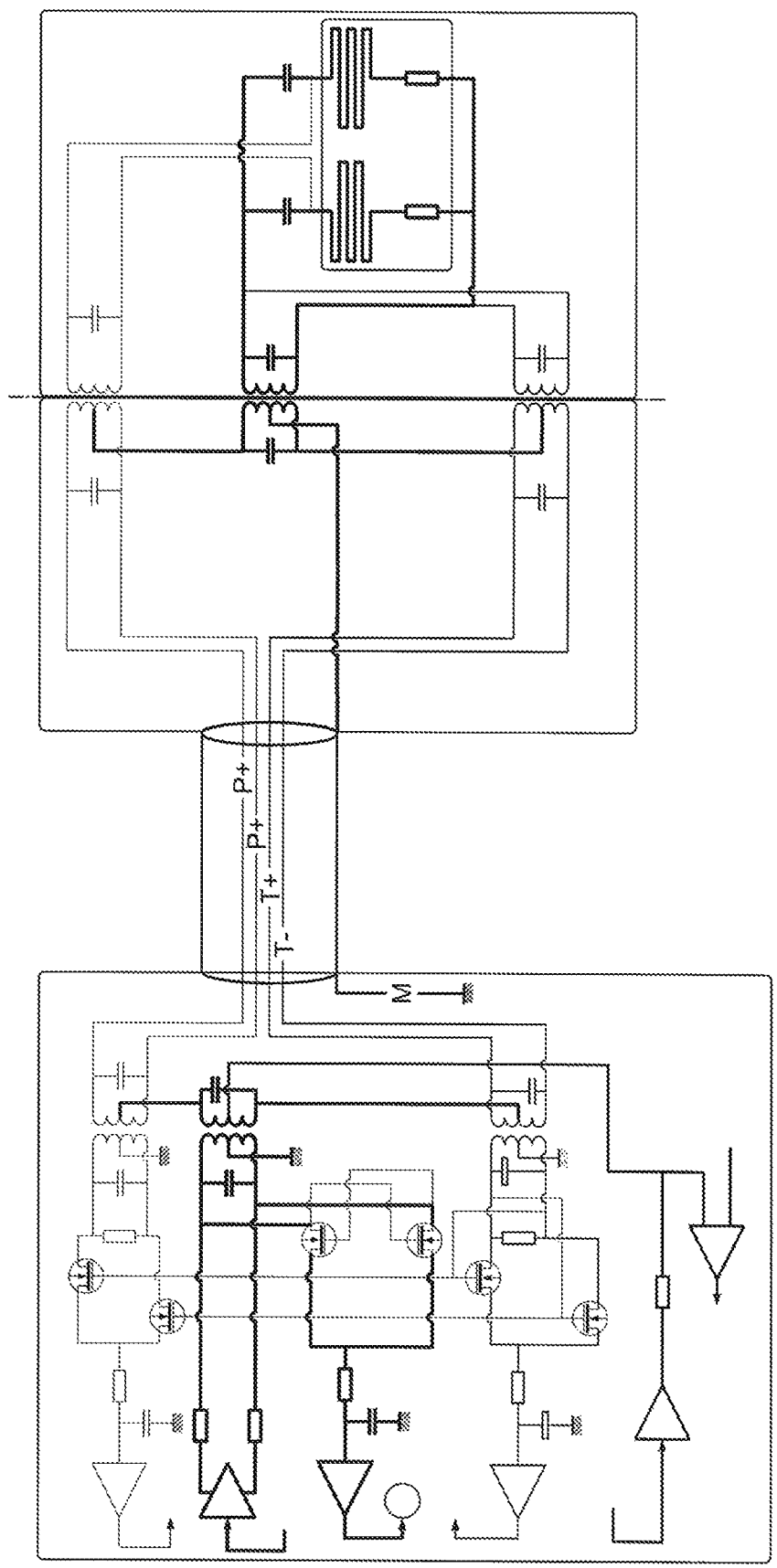
FIG. 4 is a diagram illustrating the system for measuring pressure of a tire of a vehicle including a sensor and a stationary portion in a third particular embodiment of the invention.

The coupling between the stationary portion and the sensor could equally well take place by inductive connections both for communicating measurements and for power supply, or likewise via capacitive connections both for communicating measurements and for power supply. FIG. 4 thus shows coupling between the stationary portion and the sensor that takes place entirely by inductive coupling. This embodiment shown in FIG. 4 makes it possible to have a measurement device of structure that is simplified.

Naturally, the sensor may be configured differentially from the above description. For example, in the second embodiment, the printed circuit card need not include an opening connecting the orifice to the outside. This makes it possible to make the sensor insensitive to variations of atmospheric pressure. Under such circumstances, the orifice may be filled with air or with a gas other than air, the orifice having no contact with the environment outside said card. The orifice can thus be filled with an inert gas.

The invention claimed is:

1. A device for measuring the pressure of a vehicle tire, the device comprising:
    a sensor comprising a printed circuit card having a portion that is to be subjected to the pressure for measurement, the printed circuit card having strain detectors mounted on said portion to measure deformation of the printed circuit card under the influence of said pressure, the sensor being designed to be secured to the tire of pressure that it is desired to measure; and
    a stationary portion subjected to be secured to the vehicle facing a path of the sensor to receive measurements acquired by the sensor;
    the printed circuit card having a first main face and a second main face, the components of the sensor that serve as coupling components between the sensor and the stationary portion of the sensor being arranged on the second main face of said printed circuit card outside the portion that is to be subjected to the pressure for measurement.

2. The device according to claim 1, wherein the printed circuit card includes a central orifice extending from the second main face towards the first main face but without opening out into said first main face, the portion that is to be subjected to the pressure for measurement thus being formed by the central zone of minimum thickness defined on top by the bottom of the orifice and at the bottom by the first main face.

3. The device according to claim 1, wherein the printed circuit card includes an orifice extending inside said printed circuit card without opening out in said first main face or said second main face, the portion that is to be subjected to the pressure for measurement thus being formed by the central zone of minimum thickness defined on top by the bottom of the orifice and at the bottom by the first main face.

4. The device according to claim 3, wherein the printed circuit card further includes an opening extending from the second main face towards the orifice and opening out in said orifice.

5. The device according to claim 3, wherein the orifice is filled with a gas other than air.

6. The device according to claim 1, wherein at least one of the strain detectors includes a track of electrically conductive material arranged on or in the printed circuit card and sensitive to deformation of said card.

7. The device according to claim 1, wherein the printed circuit card has two strain detectors forming a measurement half-bridge and two capacitors) associated with the half-bridge for putting the half-bridge into resonance when the half-bridge is powered.

8. The device according to claim 1, including power supply means for powering the sensor via the stationary portion, the stationary portion and the sensor being configured to power the sensor by high frequency AC power supply.

9. The device according to claim 8, wherein the device is configured so that the high frequency lies in the range 50 MHz to 300 MHz.

10. The device according to claim 8, wherein the stationary portion and the sensor are coupled together without any wired connection.

11. The device according to claim 1, wherein the stationary portion and the sensor are coupled together by inductive and capacitive connections.

12. The device according to claim 1, including means for measuring the temperature of at least one of the strain detectors.

13. The device according to claim 12, wherein the means for measuring temperature comprise means for taking a measurement of the power supply to the strain detectors.

14. The device according to claim 1, wherein the stationary portion includes wired connection means connecting to processor means remote from the device, said wired connection means comprising a cable suitable for providing differential transmission of the various signals between the device and the processor means.

15. The device according to claim 1, wherein the stationary portion includes a printed circuit card providing the coupling between the stationary portion and the sensor).

16. A system for measuring the pressure of a vehicle tire, the system comprising a measurement device for measuring the pressure of the tire according to claim 1 and processor means for processing measurements acquired by the measurement device, the processor means being for mounting on the vehicle remotely from the tire, the stationary portion being for securing to the vehicle facing a path of the sensor for receiving measurements acquired by the sensor and for transmitting them to the processor means.

17. The system according to claim 16, wherein the processor means include a power supply circuit for powering the stationary portion and a monitor circuit for monitoring an output of said power supply circuit.

18. The system according to claim 17, wherein the monitor circuit includes means for sending an electric pulse to the power supply circuit and means for detecting the return wave following the pulse.

* * * * *